United States Patent [19]
Kirtley et al.

[11] Patent Number: 5,523,686
[45] Date of Patent: Jun. 4, 1996

[54] PROBES FOR SCANNING SQUID MAGNETOMETERS

[75] Inventors: John R. Kirtley, Katonah, N.Y.; Mark B. Ketchen, Hadley, Mass.

[73] Assignee: International Business Machines Corporation, Armonk, N.Y.

[21] Appl. No.: 298,242

[22] Filed: Aug. 30, 1994

[51] Int. Cl.[6] .................... G01R 33/035; G01R 33/16; H01L 39/22

[52] U.S. Cl. .................... 324/248; 324/201; 505/846; 327/527

[58] Field of Search .................... 324/248, 201, 324/244, 260–262; 505/845, 846, 842–844, 874, 705; 338/325; 327/527; 257/31

[56] References Cited

U.S. PATENT DOCUMENTS

| | | | |
|---|---|---|---|
| 4,224,630 | 9/1980 | Kroger | 324/248 |
| 4,320,341 | 3/1982 | Lutes | 324/248 |
| 4,554,567 | 11/1985 | Jillie et al. | 257/36 |
| 4,588,947 | 5/1986 | Ketchen | 324/248 |
| 5,053,834 | 10/1991 | Simmonds | 324/248 |
| 5,173,660 | 12/1992 | Marsden | 324/248 |
| 5,218,297 | 6/1993 | Nakane et al. | 505/705 |

FOREIGN PATENT DOCUMENTS 0184670  6/1986  European Pat. Off. ............... 324/248

OTHER PUBLICATIONS

Scientific American Aug. 1994 pp. 46–53 "SQUIDs" John Clarke.

J. Appl. Phys 58 (11) Dec. 1, 1985 pp. 4322–4325 M. B. Ketchen "Design of improved integrated thin–film planar dc SQUID gradiometers".

J. Appl. Phys 59 (20) Nov. 11, 1991 pp. 2609–2611 M. B. Ketchen et al "Sub–μm, planarized, Nb–AIO$_x$–Nb Josephson process for 125 mm . . . ".

IBM Tech. Disc. Bulletin V.27 #10A Mar. 1985 pp. 5847–5847 Bermon et al "Integrated Thin–Film Miniature SQUID Magnetometer".

Primary Examiner—Sandra L. O'Shea
Assistant Examiner—Jay M. Patidar
Attorney, Agent, or Firm—Stephen S. Strunck

[57] ABSTRACT

Improved probes for miniaturized scanning magnetometers (scanning microscopes), particularly those utilizing superconducting quantum interference devices (SQUIDs), are provided by the invention. The improved probes can have sub–μm$^2$ effective pickup loop areas and enhanced shielding through the use of progressively wider double groundplane structures which result in improved probes having high spatial resolution.

11 Claims, 7 Drawing Sheets

PROBES FOR SCANNING SQUID MAGNETOMETERS

BACKGROUND OF THE INVENTION

The present invention relates generally to superconducting quantum interference devices (SQUIDs) and more particularly to improved sensors with small effective pickup loop areas and good shielding which provide high spatial resolution when used with scanning SQUID microscopes.

Figure 1:
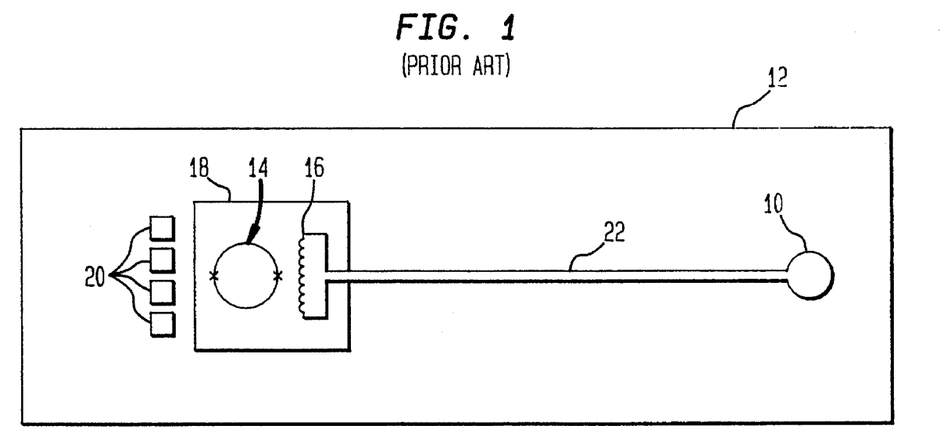
FIG. 1 is a schematic, plan view of a prior art integrated thin-film miniature scanning SQUID magnetometer.

A typical SQUID magnetometer circuit uses a SQUID with its input coil connected to a pickup coil by a twisted pair of superconducting wires. The SQUID itself is typically housed in a superconducting shield to screen it from ambient magnetic fields and to minimize the effects of fields associated with operating the SQUID on the field distribution to be measured. Planar thin-film SQUIDs of low self-inductance (~100 pH) with integrated spiral input coils can be used with wire-wound magnetometer pickup loops to give improved sensitivity. However, for certain applications, such as studying flux trapping phenomena in a superconducting groundplane, a sensitive magnetometer with an extremely small pickup loop is required. Since standard SQUID systems cannot be used for this, the miniature, very sensitive magnetometer of FIG. 1 having high-spatial-resolution is provided by an integrated, planar thin-film magnetometer fabricated on a single chip. FIG. 1 (from IBM Technical Disclosure Bulletin Vol. 27, No. 10A, March 1985) shows the magnetometer, in which a single (or double) turn pickup loop 10 is fabricated on chip 12. Pickup loop 10 has very low inductance. A groundplaned low noise DC SQUID 14 is fabricated with, for example, a three-turn spiral input coil 16. Groundplane 18 acts to shield SQUID 14 from stray magnetic fields. An inverted structure is used to maximize the separation between the SQUID loop 14 and groundplane 18 for better coupling. Input/Output (I/O) pads 20 are also provided on chip 12. A low inductance stripline connector 22 is used to connect input coil 16 and pickup coil 10. Alternatively, stripline connector 22 can be attached directly to the junction region of SQUID 14 such that stripline connector 22 and pickup coil 10 form an integral part of the SQUID's self inductance.

A simple single ring SQUID having a sub-$\mu m^2$ pick-up area with the entire SQUID being scanned in close proximity to the surface requires deep (<0.5 µm) sub-µm minimum feature size for all fabrication levels of the SQUID. The arrangement of FIG. 1 has a small pick-up loop that is connected to the rest of the SQUID structure some distance away by a section of low inductance interconnect. The pick-up loop can be an integral part of the SQUID or part of an input circuit that is directly connected to the input coil of a SQUID on the same chip or part of an input circuit that is subsequently wire bonded to the input coil of a SQUID on a physically separate chip. In the latter case, the technology for fabricating the loop can be very different from that used to fabricate the SQUID, while in the former a sub-$\mu m^2$ pick-up structure can be formed with only one fabrication level with deep sub-µm feature size. Minimizing the interconnect inductance will improve sensitivity, especially in the case of fully integrated devices. For these devices, which can be roughly 10 times more sensitive than the two-chip implementation, the detailed design of the pick-up loop structure and the transition to a low-inductance interconnect arrangement is very important.

Figure 2:
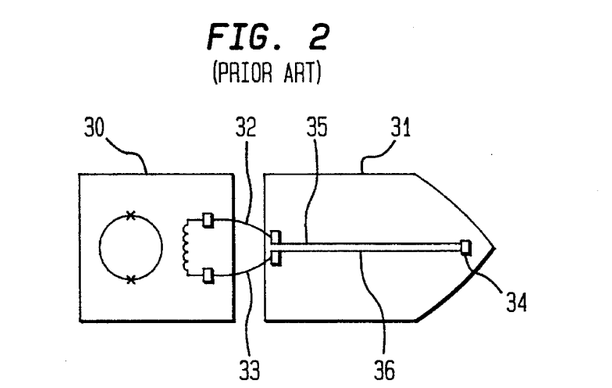
FIG. 2 is a schematic, plan view of a two chip miniature SQUID magnetometer.
Figure 3:
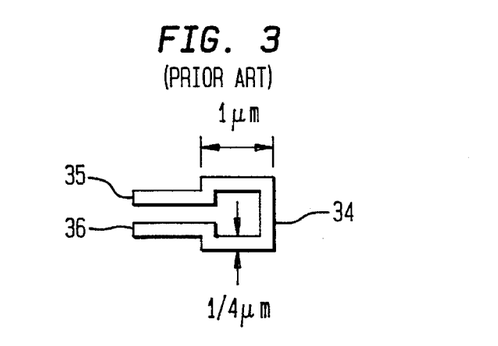
FIG. 3 is an enlarged view of the pickup loop structure of the magnetometer of FIG. 2.

One implementation of a sub-µm pick-up loop is shown in FIGS. 2 and 3. This is a two chip arrangement 30,31 with superconducting wire bonds 32,33. Pick-up loop structure 34 requires only one level of superconducting metal, 100 nm of Nb in this case. The linewidth is 0.25 µm, pick-up loop 34 is 1 µm across, and leads 35,36 have a center-to-center spacing of 0.5 µm. The design has the drawback that while pick-up loop 34 itself has a well-defined 1 $\mu m^2$ area, leads 35,36 have a significant effective pick-up area amounting to about 0.5 $\mu m^2$ per µm of length. The spatial resolution is thus significantly degraded, especially for targets such as a line current source where the magnetic field falls off as 1/r. This structure also has a high lead inductance of about 1 pH/µm.

A significant improvement can be made by adding a single groundplane above or below leads 35,36. This reduces both the effective pick-up area of leads 35,36 and their inductance. The wider this groundplane is in the vicinity of the pick-up loop, however, the more it can distort the field being measured.

SUMMARY OF THE INVENTION

Improved probes for miniaturized scanning magnetometers (scanning microscopes), particularly those utilizing superconducting quantum interference devices (SQUIDs), are provided by the invention. The improved probes can have sub-$\mu m^2$ effective pickup loop areas and enhanced shielding through the use of progressively wider double groundplane structures which result in improved probes having high spatial resolution.

BRIEF DESCRIPTION OF THE DRAWINGS

Other features and advantages of the present invention will be apparent from the following description taken in connection with the accompanying drawings, wherein.

DETAILED DESCRIPTION OF THE INVENTION

Figure 4:
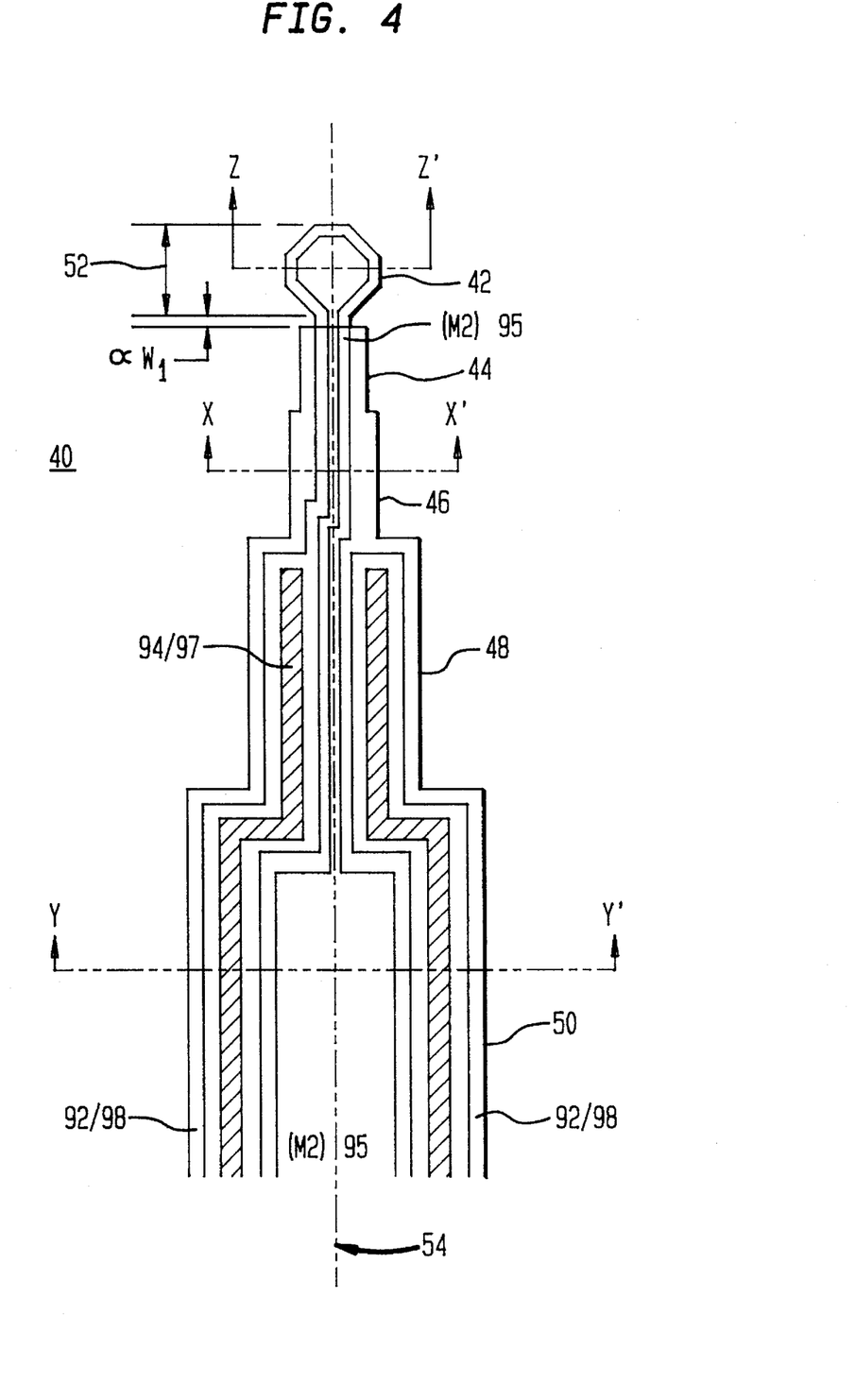
FIG. 4 is a schematic, plan view of the improved probe of the invention.

There is provided by the present invention the multiple groundplane probe 40 shown in FIG. 4. This structure may be fabricated with a 3-level-of-metal Josephson technology process which may be, for example, an extension of the 2-level process described in the article in *Appl. Phys. Lett.*, 59 (20), November 1991, by Ketchen, et al., which article is herein incorporated by reference. Thus, and advantageously, the other components of the magnetometer, such as a SQUID can be manufactured at the same time as is the probe of the invention. The probe of the present invention minimizes lead pick-up area, and minimizes the distortion of the local field being measured.

Figure 5:
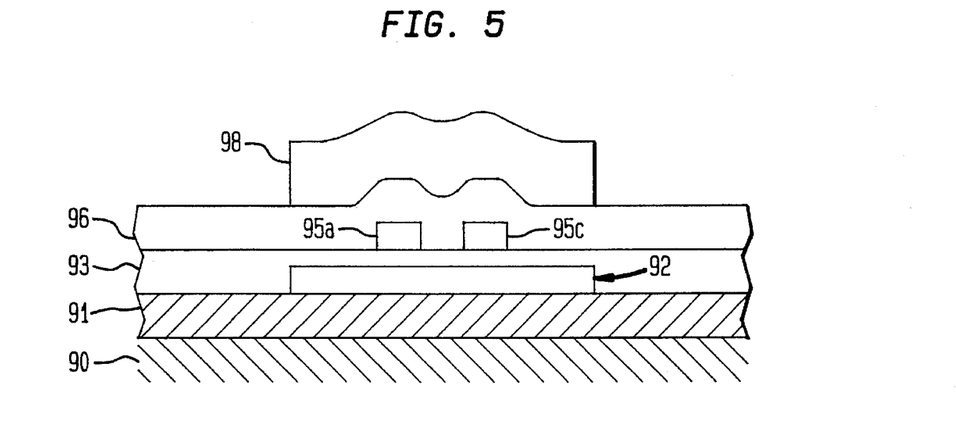
FIG. 5 is a cross-sectional view of the probe of FIG. 4 taken along plane X—X' of FIG. 4.
Figure 6:
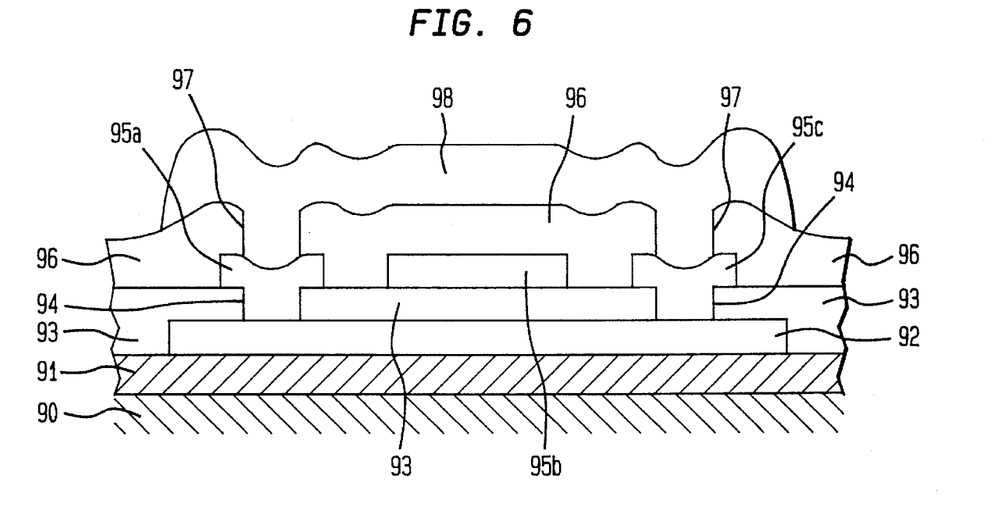
FIG. 6 is a cross-sectional view of the probe of FIG. 4 taken along plane Y—Y' of FIG. 4.
Figure 7:
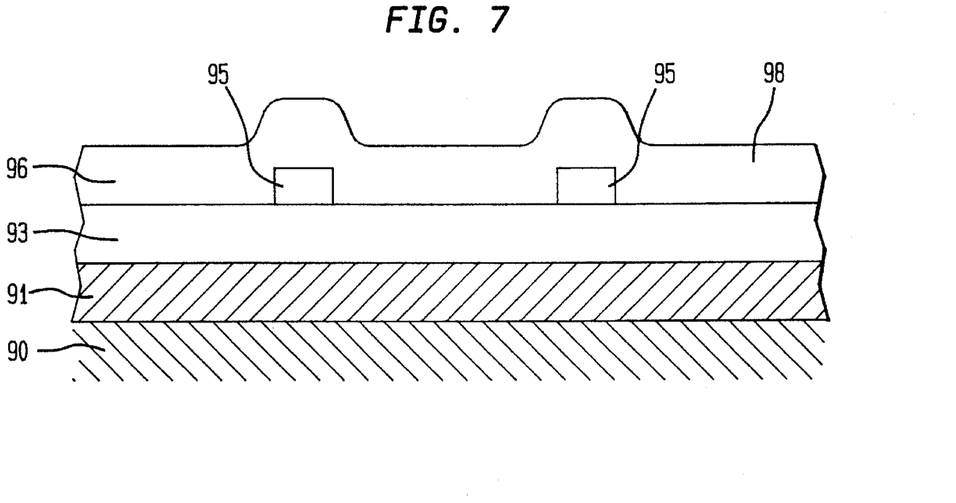
FIG. 7 is a cross-sectional view of the probe of FIG. 4 taken along plane Z—Z' of FIG. 4.

The present invention allows a <1 μm² pick-up area with deep sub-μm feature size required for only one level and consists of a single-level pick-up loop 42 in combination with a progressively wider double ground-planed lead structure in regions 44, 46, 48 and 50. Cross sections through three different regions of this lead structure are shown in FIGS. 5, 6 and 7. The double ground-planed structures of FIGS. 5 (section X—X') and 6 (section Y—Y') give somewhat lower lead inductance (by $\leq 2 \times$) and considerably lower effective pick-up area than a single groundplane structure. If a single groundplane lowers the pick-up area of the leads by a factor of K, the double groundplane will generally lower it by $> K^2$.

FIG. 6 shows a totally enclosed strip line configuration with zero effective pick-up area and a low inductance. The narrow ground-planes near the pick-up loop (FIG. 5) minimizes the distortion of magnetic fields in the vicinity of the pick-up loop while immediately cutting down the lead pick-up area and inductance. After one or more widening steps the width is sufficient to implement the totally enclosed configuration. This wider structure is then far enough away that it does not significantly distort the field at the pick-up loop.

Typically the fabrication process begins with providing, by thermal oxidation, a layer 91 of $SiO_2$ on a silicon substrate wafer 90. Typically, layer 91 is about 3000 Å in thickness. Next, using photolithographic techniques known in the art, the patterned first (M1) Niobium metal line structure 92 shown in FIGS. 5 (for region 46) and 6 (for region 50) is made. Structure 92 is typically 2000 Å in thickness. Structure 92 constitutes the first, or bottom, groundplane which extends the lengths of regions 44, 46, 48 and 50.

Next, a layer 93 of $SiO_2$ of typical thickness of about 5000 Å is sputtered over the surfaces of layers 91 and 92. This is the first insulating layer (I1). Layer 93 is then planarized using techniques known in the art reducing its thickness to about 1500 Å above layer 92 at the end of the planarization process. Next, first vias are etched through layer 93 in regions 48 and 50 (locations 94 in FIG. 6), to expose metal 92 at the bottoms thereof.

Thereafter, again using photolithographic techniques, a second layer (M2) of Niobium metal about 2000 Å thick is selectively patterned onto the surface of layer 93 to form the three coplanar lines 95a, 95b and 95c shown in FIG. 6 and lines 95a and 95c shown in FIG. 5. Metal lines 95a, 95b, and 95c will be in contact with metal layer 92 through the first vias. A second insulating (I2) layer 96 of quartz ($SiO_2$) about 3000 Å in thickness is next sputtered over the surface to cover the surface of layer 93 and conformally cover layer 95. Second vias are next etched through insulating layer 96 in regions 48 and 50 (locations 97 in FIG. 6) thereby exposing second metal layer 95 at the bottoms thereof.

Lastly, and again using photolithographic techniques, a third patterned layer (M3) of Niobium 98 about 5000 Å in thickness is selectively formed on second quartz insulating layer 96 as shown in FIGS. 5 and 6. Layer 96 is in electrical contact with layer 95 through the second vias (locations 97 in FIG. 6). This is the second or top groundplane and like the first or bottom groundplane extends the length of segments 44, 46, 48 and 50.

A cross-section Z—Z' through probe tip 42 in probe tip region 52 is shown in FIG. 7. It will be appreciated that the cross-section at location 44 of probe 40 is similar to that of FIG. 5, except for dimensions, and that the cross-section at location 48 of probe 40 is similar to that of FIG. 6, except for dimensions and except that line 95c terminates in section 48. In the plan view of FIG. 4, the width of the first and second groundplanes are seen increasing in step-wise fashion as the distance from tip 42 increases along the longitudinal axis 54 of probe 40, but other geometric structures, such as tapers, are also within the contemplation of the invention. The top and bottom groundplane structures in region 44 terminate at a distance $\alpha W_1$ from tip region 52.

Figure 8:
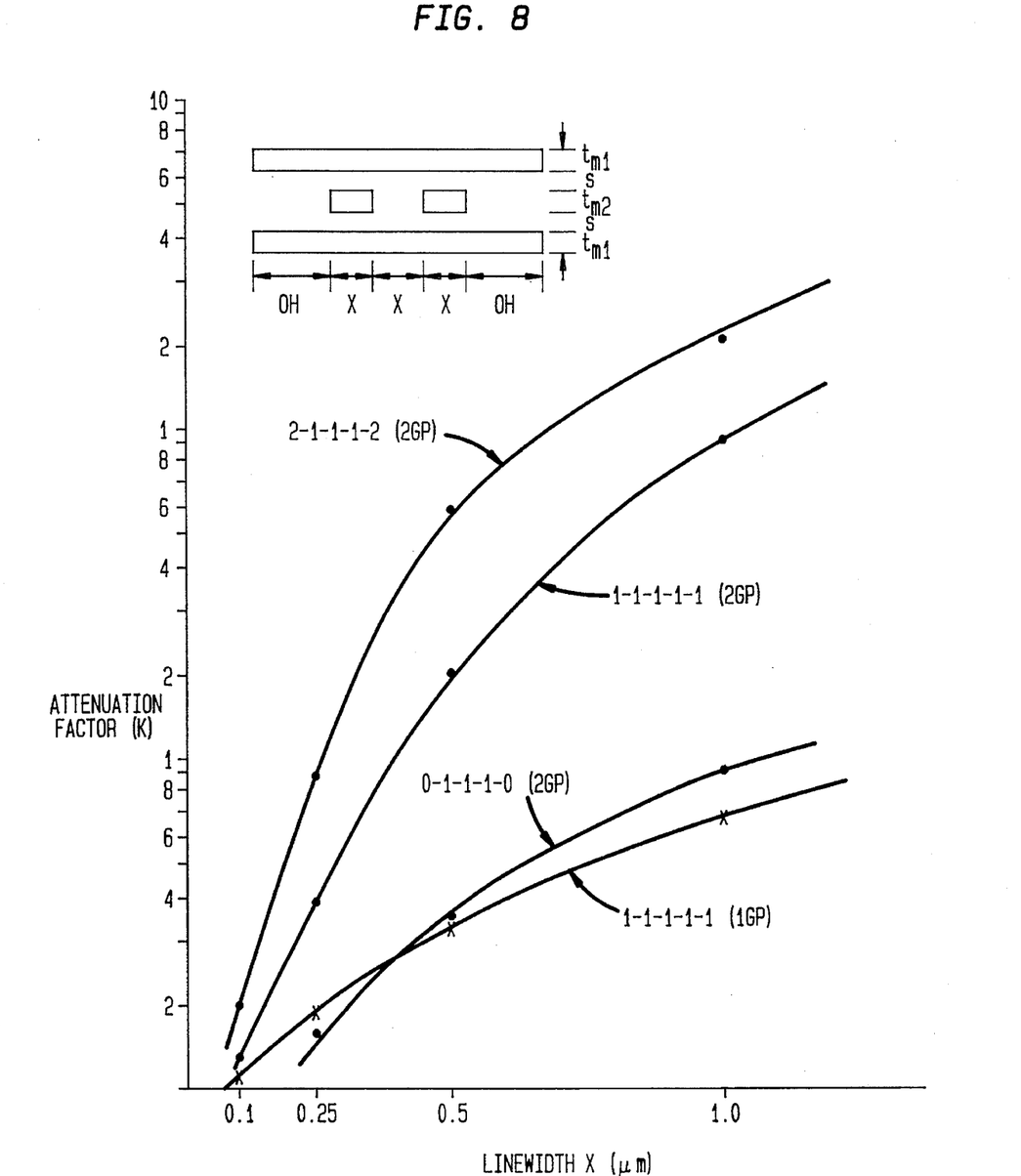
FIG. 8 is a graph of attenuation factor (K) versus linewidth for the double groundplane probes of the invention and for a single groundplane probe wherein the inset shows the simplified geometry used for the calculations.

FIG. 8 shows the calculated attenuation factor K as a function of linewidth X for the simplified geometry shown in the inset of FIG. 8 for various groundplane configurations of the present invention. The designator 2-1-1-1-2 implies a lead structure with two leads of width X, a space of width X and a groundplane overhang (OH) on each side of 2X. The superconductor in all cases was Nb with a London penetration depth λ of 0.086 μm. The metal thicknesses $t_{m1}$ and $t_{m2}$ were all 0.15 μm except when X is <0.15 μm, $t_{m2}$=X. The vertical separation, S, between metal layers was 0.15 μm in all cases. The degradation in attenuation (K factor) as X was decreased is a direct consequence of the less favorable aspect ratios and the constant value λ. The effectiveness of the two groundplane structures (2 GP) as compared with the one groundplane structure (1GP) is clearly illustrated by the two 1-1-1-1-1 curves. In general, $K(2\ GP) > K^2(1\ GP)$.

Figure 9:
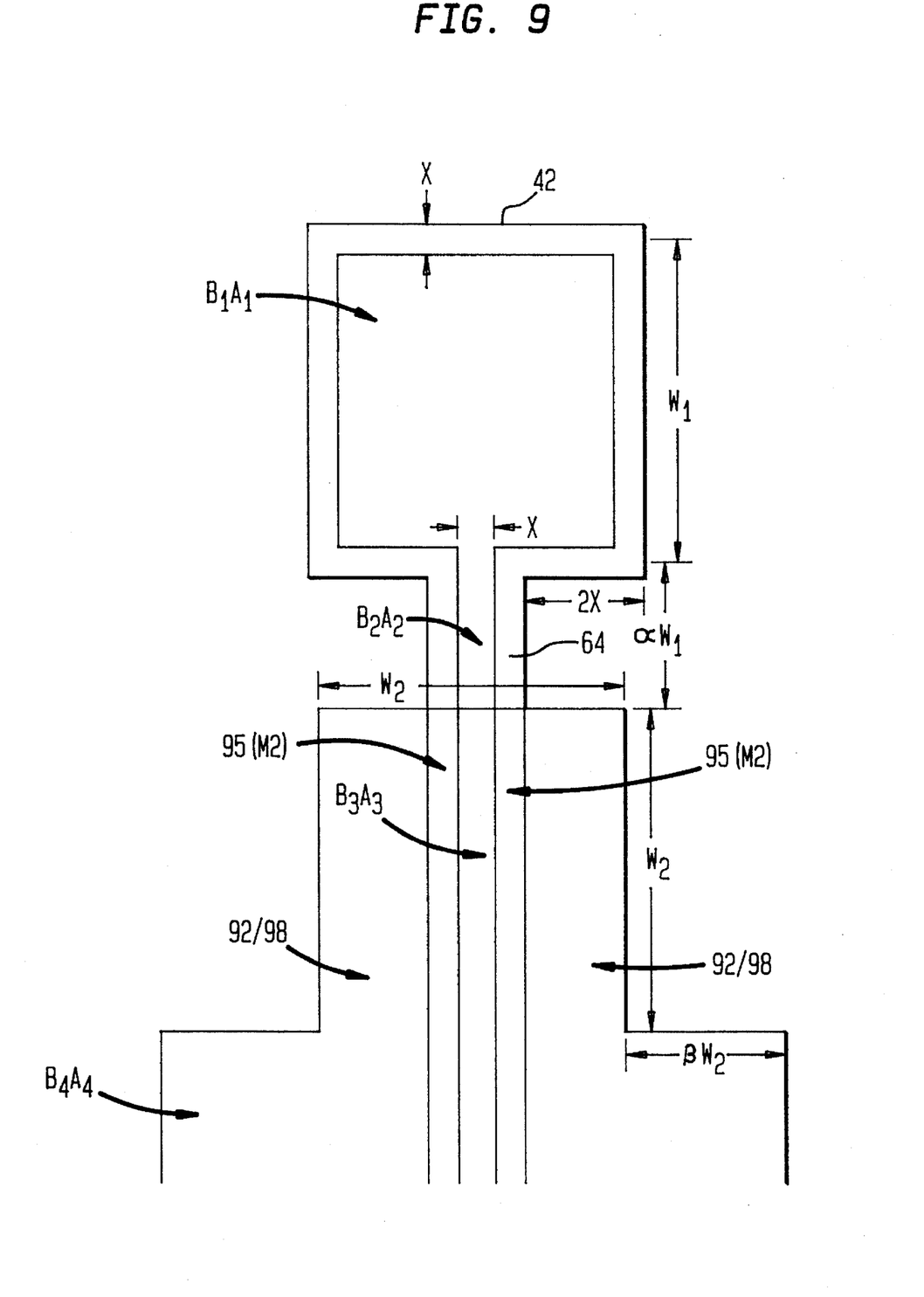
FIG. 9 is a schematic, plan view of a pickup loop, nearby leads and groundplane structure according to the invention.

With reference to FIG. 9, the most critical part of the design of the probe of the invention are the structures of pickup loop 42, leads 95(M2) and groundplane structure 92/98 in the immediate vicinity of pickup loop 42. The general situation is as shown in FIG. 9, where $B_1$, $B_2$, $B_3$ and $B_4$ are the average magnetic fields applied perpendicular to the various areas and $A_1$, $A_2$, $A_3$ and $A_4$ are the effective pickup areas. Fields in the plane of pickup loop 42 do not couple to the loop or groundplane structure. Assuming a double groundplane structure and that the screening currents flowing in area $W_2 X W_2$ are dominated by the action of screening the field $B_3$ from that area and provided $\beta \gtrsim 0.5$ and the groundplane structure continues to widen to join the totally enclosed groundplane structure over a modest distance, the contribution from $B_4$ will be small enough to not consider further.

The magnetic flux $\phi_A$ applied to the magnetometer and the measured field $B_{meas}$ is then given by:

$$\phi_A = B_1 A_1 + B_2 A_2 + B_3 A_3 + \ldots$$

$$\phi_A = B_1(W_1^2) + B_2(2X\alpha W_1) + B_3 \left( W_2^2 \frac{2X}{3W_2} + \frac{2XW_2}{K} \right) + \ldots$$
$$\underbrace{\phantom{B_1(W_1^2)}}_{A_1} \underbrace{\phantom{B_2(2X\alpha W_1)}}_{A_2} \underbrace{\phantom{B_3 \left( W_2^2 \frac{2X}{3W_2} + \frac{2XW_2}{K} \right)}}_{A_3}$$

$$B_{meas} = B_1 + B_2 \left( 2X \frac{\alpha}{W_1} \right) + B_3 \left( \frac{2XW_2}{KW_1^2} + \frac{2XW_2}{3W_1^2} \right) + \ldots$$

The first term arises from the geometric pickup area of the loop. The second term arises from the pickup area of the ungroundplaned lead structure between the loop and the beginning of the groundplanes. The third term contains two separate components. The first of these arises from the geometric pickup area of the leads in this section (2X $W_2$) reduced by the groundplane screening factor K. The second is associated with the flux that is deflected by the groundplanes and ends up passing through the geometric pickup area of the leads between the pickup loop and the groundplane edge. Calculations indicate that for $W_2$~1–2 µm most of this deflected flux passes within a few 0.1 µm's of the groundplane edge. By way of example, if X=0.1 µm, $W_1$=0.1 µm, $W_2$=1.0 µm and α=0.4, then:

$$B_{meas}=B_1=B_2(0.08)+B_3(0.07+0.06)$$

which represents a fairly balanced design with 20% parasitic signal.

As another example, consider the case X–0.25 µm, $W_2$=1.25 µm and α=0.5. In this case, $$B_{meas}=B_1+B_2(0.25)+B_3(0.21+0.16)$$

so that the parasitic component amounts to about 60%.

As a final case, with X=0.5 µm, $W_1$=1.0 µm, $W_2$=1.5 µm and α=0, the result is:

$$+B_2(0)$$
$$B_{meas} = B_1 + B_3(0.5 + 0.45) + \ldots$$

Or approximately a 100% increase in effective pickup area.

It is thus possible to get pickup areas ≤1 µm² in size but in one level with the deep sub-µm definition required. The positive effects become increasingly more important as X increases.

Figures 10, 11:
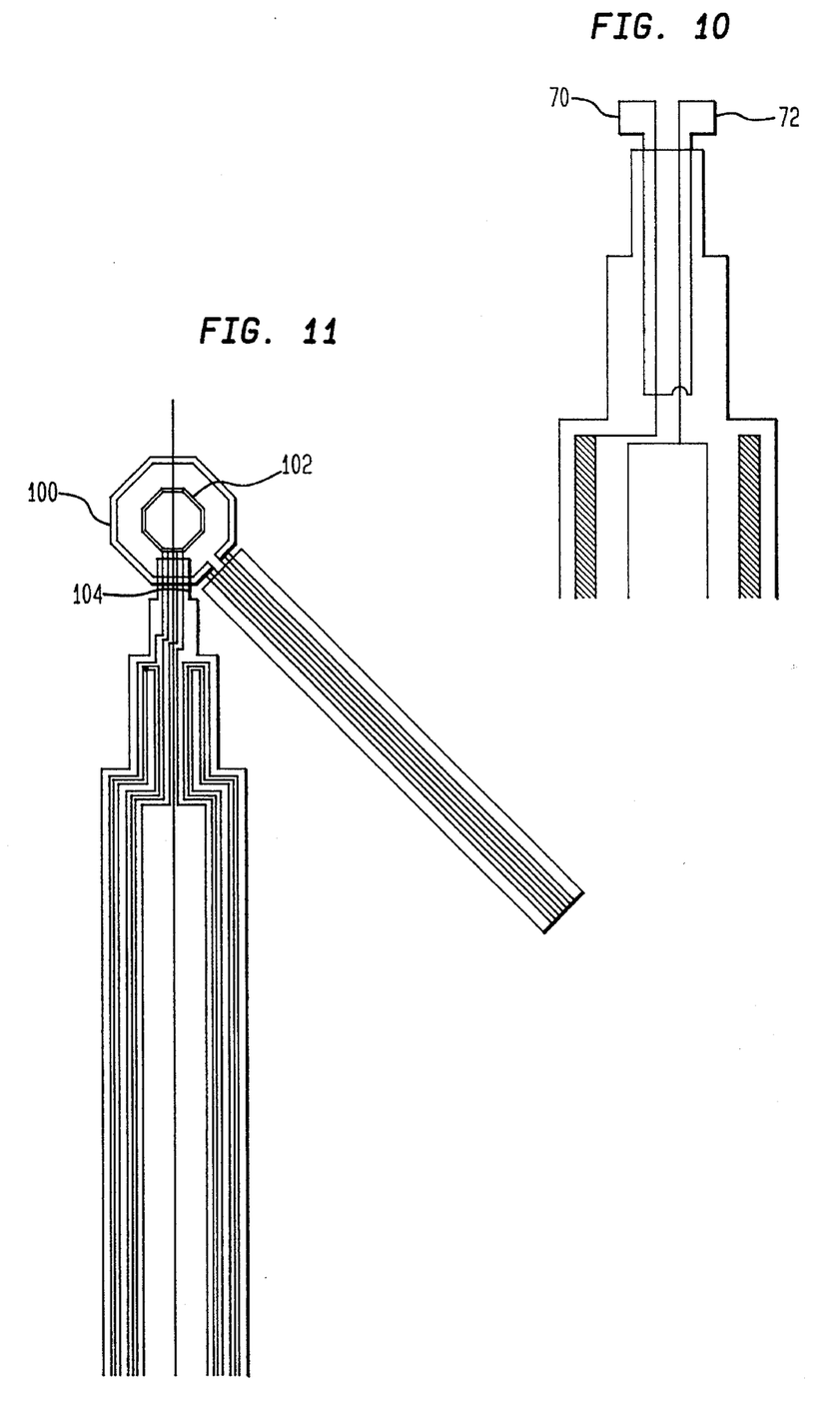
FIG. 10 is a probe according to the invention in the form of a gradiometer.
FIG. 11 is a probe in accordance with the invention for use in a susceptometer.

The arrangement shown in FIG. 4 is clearly a magnetometer tip. In FIG. 10, the gradiometer version of this invention is shown. Here, two small area pick-up loops 70, 72 wound in opposite sense are positioned at the tip. The same groundplaned structure as with the magnetometer is used. Well away from the tip, the necessary cross-over is incorporated and the lead structure reverts to the cross section of FIG. 6. The gradiometer configuration of FIG. 10 gives improved noise/pick-up reduction and helps to further localize the response to the tip area. The design and operation of gradiometers are discussed, for example, in the paper by M. B. Ketchen in J. Appl. Phys. 58 (11), December 1985, which paper is herein incorporated by reference.

As shown in FIG. 11, another novel probe of the invention incorporates a single turn excitation (or field) coil 100 circumscribing a single pickup loop 102 where field coil 100 is on the order of about 20 µm across and pickup coil 102 is on the order of about 10 µm across. This probe may be fabricated in the manner discussed above with respect to the magnetometer probe except that here, again through the use of photolithographic techniques, the lower groundplane terminates a distance away from excitation coil 100 in the vicinity of 104. The top groundplane generally continues over excitation loop 100 but does not extend over pickup loop 102. Excitation coil 100 is formed of the same metal as the lower groundplane and is on the same level of metallization.

Figure 12:
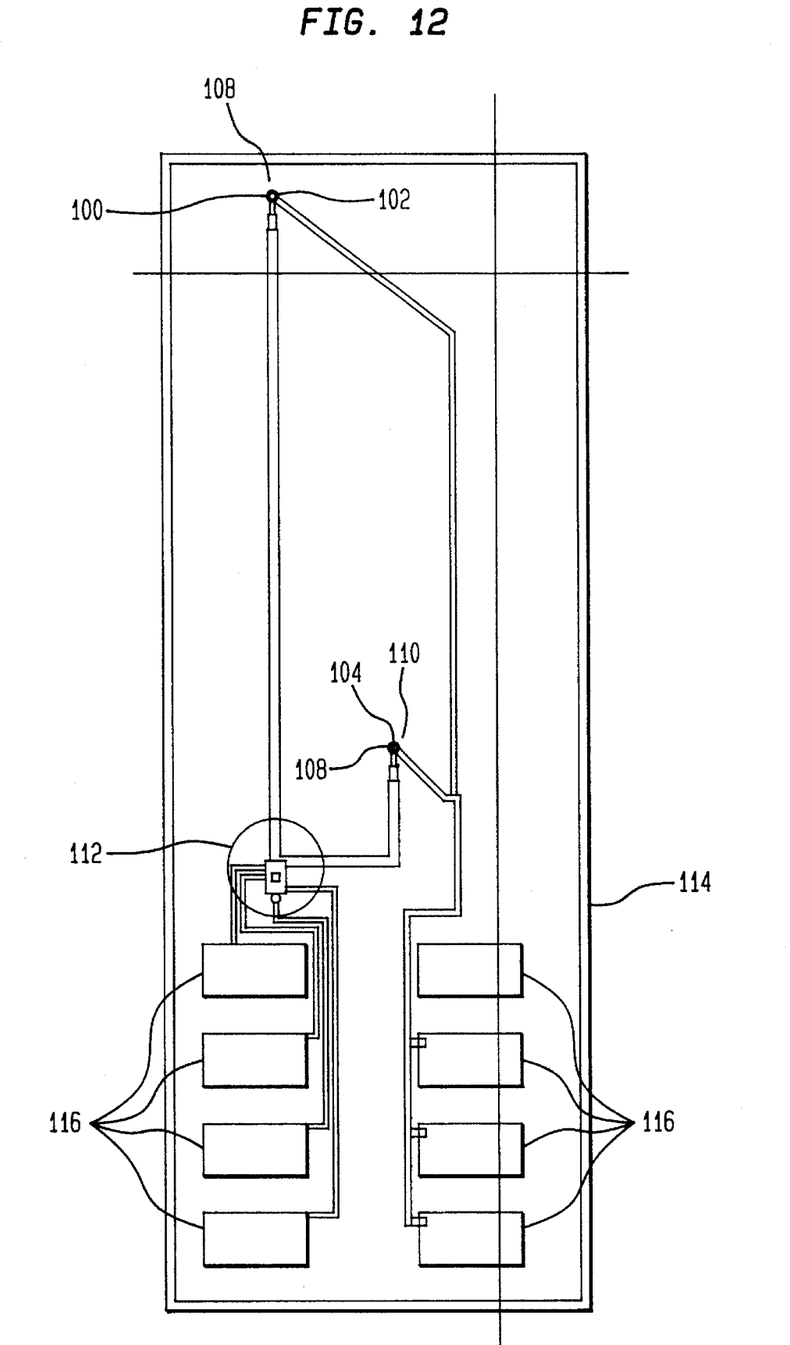
FIG. 12 is a scanning microscope susceptometer in accordance with the invention.

In this arrangement, excitation coil 100 locally induces a magnetic moment in the underlying sample which in turn couples back to magnetometer pickup loop 102. The direct coupling between field coil 100 and pickup loop 102 is cancelled out by incorporating in a series wired (but opposite sense) configuration an identical pickup loop 105 and field coil 106 located on the same chip far from active tip 108 as shown in FIG. 12. Active tip 108 is then scanned over the surface under study while reference tip 110 remains far away from any material. A SQUID or other read out device is located at region 112 of chip 114. Input/Output pads are located at 116. Examples of applications of this arrangement include use as a susceptibility microscope or for eddy current non-destructive testing on a microscopic length scale. In the presence of a uniformmagnetic field in the plane of the SQUID chip, this arrangement can also function as a scanning nuclear magnetic resonance (NMR) microscope. Such devices made be integrated on a single substrate using the planar, thin film, 3-level of metal technology discussed above.

It will be apparent to those of working skill in the art that modifications of this invention may be practiced without departing from the essential scope of this invention such as, for example, the shape of the pickup coils may be varied and are not necessarily restricted to one loop or level and that use may be made of other high and low Tc superconducting materials in place of the Niomium metal used in conjunction with the foregoing description.

We claim:

1. An improved probe for scanning magnetometer devices comprising:

at least three regions progressively narrower in width terminating in a probe tip region;

a bottom groundplane structure extending the length of said three regions and separated from said probe tip region;

a top groundplane structure extending the length of said three regions and separated from said probe tip region; and probe leads extending the length of said three regions and terminating in a probe tip in said probe tip region.

2. The probe of claim 1 wherein said probe tip is in the form of a loop.

3. The probe of claim 1 wherein said probe tip further comprises two loops which are oppositely connected by a crossing of said probe leads within one of said regions.

4. The probe of claim 1 wherein said probe leads at the end opposite from said probe tip region are coupled to a SQUID.

5. The probe of claim 4 wherein said coupling is inductive.

6. The probe of claim 4 wherein said coupling is direct.

7. An improved probe for scanning SQUID magnetometers comprising:

a substrate having at least three regions, said regions being progressively narrower in width in progressing from one end of said probe to the other along the probe longitudinal axis and terminating in a probe tip region, the third region being closest to said tip region, the first region being at said one end and said second region being inbetween said first and third regions, a first oxide layer on the surface of said substrate;

a bottom groundplane structure on the surface of said first oxide layer extending the length of said three regions, but being separated from said probe tip region;

a second oxide layer over the surfaces of said groundplane and said first oxide layer;

first, second and third coplanar metallic lines situated on the surface of said second oxide layer in said first region insulated from each other by a third layer of oxide, said first and third lines being electrically connected to said bottom groundplane structure through vias extending the length of said first region;

first, second and third coplanar metallic lines situated on the surface of said second oxide layer in said second region insulated from each other by a third layer of oxide, said third coplanar line terminating in said second region, with said first and third lines being electrically connected to said bottom groundplane structure through vias extending the length of said second region;

first and second coplanar metallic lines situated on the surface of said second oxide layer in said third region insulated from each other by said third layer of oxide; and a top groundplane structure on the surface of said third oxide layer extending the length of said three regions, but being separated from said probe tip region, said top groundplane being electrically connected to said first and third lines in said second and first regions through vias extending the length of said second and first regions.

8. An improved probe for scanning magnetometer devices comprising:

at least three regions progressively narrower in width terminating in a probe tip region;

a bottom groundplane structure extending the length of said three regions and separated from said probe tip region;

probe leads extending the length of said three regions and terminating in a probe tip in said probe tip region, said probe tip region further including an excitation coil, said excitation coil circumscribing said probe tip; and a top groundplane structure extending the length of said three regions and extending over said excitation coil but not over said probe tip.

9. An improved probe for a scanning microscope comprising:

a substrate having at least three regions, said regions being progressively narrower in width in progressing from one end of said probe to the other along the probe longitudinal axis and terminating in a probe tip region including a first pickup loop, the third region, the first region being at said one end and said second region being inbetween said first and third regions being closest to said tip region;

a first oxide layer on the surface of said substrate;

a bottom groundplane structure on the surface of said first oxide layer extending the length of said three regions and terminating a distance away from a first structure which circumscribes said first pickup loop;

a second oxide layer over the surfaces of said groundplane and said first oxide layer;

first, second and third coplanar metallic lines situated on the surface of said second oxide layer in said first region insulated from each other by a third layer of oxide, said first and third lines being electrically connected to said bottom groundplane structure through vias extending the length of said first region;

first, second and third coplanar metallic lines situated on the surface of said second oxide layer in said second region insulated from each other by a third layer of oxide, said third coplanar line terminating in said second region, with said first and third lines being electrically connected to said bottom groundplane structure through vias extending the length of said second region;

first and second coplanar metallic lines situated on the surface of said second oxide layer in said third region insulated from each other by said third layer of oxide, said first and second metallic lines extending into said tip region and being connected to said first pickup loop; and a top groundplane structure on the surface of said third oxide layer extending the length of said three regions, and over said first structure but not over said first pickup loop, said top groundplane being electrically connected to said first and third lines in said second and first regions through vias extending the length of said second and first regions.

10. The probe of claim 9 wherein said first structure is made of the same material as said bottom groundplane and is on the same level as said bottom groundplane.

11. The probe of claim 9 wherein said first structure is connected in series with a second structure and said first pickup loop is connected in series, but in the opposite sense, with a second pickup loop, said second loop-like structure and said second pickup loop being situated on the same substrate as said first pickup and said first structure, but remote therefrom.

* * * * *